US009872392B2

(12) United States Patent
Shan

(10) Patent No.: US 9,872,392 B2
(45) Date of Patent: Jan. 16, 2018

(54) POWER DECOUPLING ATTACHMENT

(71) Applicant: INTERNATIONAL BUSINESS MACHINES CORPORATION, Armonk, NY (US)

(72) Inventor: Lei Shan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/176,548

(22) Filed: Jun. 8, 2016

(65) Prior Publication Data
US 2017/0359898 A1   Dec. 14, 2017

(51) Int. Cl.
*H05K 1/18* (2006.01)
*H01L 23/498* (2006.01)
(Continued)

(52) U.S. Cl.
CPC .......... *H05K 1/183* (2013.01); *H01L 21/486* (2013.01); *H01L 21/4853* (2013.01); *H01L 21/563* (2013.01); *H01L 23/49827* (2013.01); *H01L 23/49833* (2013.01); *H01L 23/49838* (2013.01); *H01L 23/49866* (2013.01); *H01L 23/49894* (2013.01); *H01L 24/81* (2013.01); *H05K 1/0313* (2013.01); *H05K 1/09* (2013.01); *H05K 1/115* (2013.01); *H05K 1/144* (2013.01); *H05K 3/30* (2013.01); *H05K 3/368* (2013.01); *H05K 3/4038* (2013.01); *H01L 2224/16235* (2013.01);
(Continued)

(58) Field of Classification Search
CPC .......................... H05K 1/183; H01L 23/49833
See application file for complete search history.

(56) References Cited

U.S. PATENT DOCUMENTS

| 5,472,900 A | 12/1995 | Vu et al. |
| 6,346,743 B1 | 2/2002 | Figueroa et al. |

(Continued)

OTHER PUBLICATIONS

Anonymous, "Method for direct chip attachment using die backside power delivery and through-silicon vias," an IP.com Prior Art Database Technical Disclosure, IP.com No. IPCOM000008596D, electronic publication date Jun. 25, 2002, 7 pgs., http://ip.com/IPCOM/000008596.

(Continued)

*Primary Examiner* — Moazzam Hossain
*Assistant Examiner* — Farun Lu
(74) *Attorney, Agent, or Firm* — Erik K. Johnson

(57) ABSTRACT

An embodiment of the invention may include a method, and resulting structure, of forming a semiconductor structure. The method may include forming a component hole from a first surface to a second surface of a base layer. The method may include placing an electrical component in the component hole. The electrical component has a conductive structure on both ends of the electrical component. The electrical component is substantially parallel to the first surface. The method may include forming a laminate layer on the first surface of the base layer, the second surface of the base layer, and between the base layer and the electrical component. The method may include creating a pair of via holes, where the pair of holes align with the conductive structures on both ends of the electrical component. The method may include forming a conductive via in the pair of via holes.

14 Claims, 3 Drawing Sheets

(51) Int. Cl.
| | |
|---|---|
| *H01L 21/48* | (2006.01) |
| *H01L 23/00* | (2006.01) |
| *H01L 21/56* | (2006.01) |
| *H05K 3/30* | (2006.01) |
| *H05K 3/40* | (2006.01) |
| *H05K 3/36* | (2006.01) |
| *H05K 1/09* | (2006.01) |
| *H05K 1/03* | (2006.01) |
| *H05K 1/11* | (2006.01) |
| *H05K 1/14* | (2006.01) |
| *H05K 3/00* | (2006.01) |

(52) U.S. Cl.
CPC .............. *H01L 2224/16265* (2013.01); *H01L 2224/81203* (2013.01); *H01L 2224/81815* (2013.01); *H01L 2924/01074* (2013.01); *H01L 2924/15724* (2013.01); *H01L 2924/15747* (2013.01); *H01L 2924/15763* (2013.01); *H01L 2924/19011* (2013.01); *H01L 2924/19041* (2013.01); *H01L 2924/19042* (2013.01); *H01L 2924/19043* (2013.01); *H01L 2924/19102* (2013.01); *H05K 3/005* (2013.01); *H05K 3/0047* (2013.01); *H05K 2201/1003* (2013.01); *H05K 2201/10015* (2013.01); *H05K 2201/10022* (2013.01); *H05K 2203/1305* (2013.01)

(56) References Cited

U.S. PATENT DOCUMENTS

| | | | |
|---|---|---|---|
| 6,418,029 | B1 | 7/2002 | McKee et al. |
| 6,670,692 | B1 | 12/2003 | Shih et al. |
| 6,888,218 | B2 | 5/2005 | Kling et al. |
| 7,672,112 | B2 | 3/2010 | Hattori et al. |
| 8,558,345 | B2 | 10/2013 | Kim et al. |
| 8,587,121 | B2 | 11/2013 | Koester et al. |
| 2002/0011351 | A1* | 1/2002 | Ogawa ................ H01L 21/4803 174/260 |
| 2007/0090464 | A1* | 4/2007 | Delgado ............... H01L 23/057 257/369 |
| 2014/0021630 | A1 | 1/2014 | Lin |
| 2014/0144676 | A1* | 5/2014 | Chung .................. H05K 1/186 174/251 |
| 2014/0287556 | A1* | 9/2014 | Choi ..................... H01L 24/11 438/121 |

OTHER PUBLICATIONS

IBM et al., "Low Inductance Chip Carrier With Decoupling Capacitors," an IP.com Prior Art Database Technical Disclosure, IP.com No. IPCOM000040103D, electronic publication date Feb. 1, 2005, 3 pgs., original disclosure information TDB Sep. 1987 p. 1786-1787, http://ip.com/IPCOM/000040103D.

IBM et al., "Integrated, Low Inductance, Small Area Capacitors for VLSI Semiconductor Packages," an IP.com Prior Art Database Technical Disclosure, IP.com No. IPCOM000049846D, electronic publication date Feb. 9, 2005, 5 pgs., original disclosure information TBD Jul. 1982 p. 883-888.

IBM, et al., "Integrated, Low Inductance, Small Area Capacitors for VLSI Semiconductor Packages," Technical Disclosure Bulletin, vol. 25, No. 2, Jul. 1982, Figures for IPCOM000049846D, pp. 883-888.

Kikuchi et al., "Development of Decoupling Capacitor Embedded Interposers Using Narrow Gap Chip Parts Mounting Technology with Wideband Ultralow PDN Impedance," 2013 IEEE Electrical Design of Advanced Packaging & Systems Symposium (EDAPS), pp. 9-12, 978-1-4799-2311-3/13, © 2013 IEEE.

* cited by examiner

POWER DECOUPLING ATTACHMENT

BACKGROUND

The present invention relates to semiconductor manufacturing, and more specifically, to fabrication of interposers.

An interposer is an electrical interface routing between one socket or connection to another. The purpose of an interposer is to spread a connection to a wider pitch or to reroute a connection to a different connection.

In microelectronics, a three-dimensional integrated circuit (3D IC) is an integrated circuit manufactured by stacking silicon wafers and/or dies and interconnecting them vertically using through-silicon vias (TSVs) so that they behave as a single device to achieve performance improvements at a reduced power and smaller footprint than conventional two dimensional processes. 3D IC is just one of a host of 3D integration schemes that exploit the z-direction to achieve electrical performance benefits. They can be classified by their level of interconnect hierarchy at the global (package), intermediate (bond pad) and local (transistor) level. In general, 3D integration is a broad term that includes such technologies as 3D wafer-level packaging (3DWLP); 2.5D and 3D interposer-based integration; 3D stacked ICs (3D-SICs), monolithic 3D ICs; 3D heterogeneous integration; and 3D systems integration.

BRIEF SUMMARY

An embodiment of the invention may include a method, and resulting structure, of forming a semiconductor structure. The method may include forming a component hole from a first surface to a second surface of a base layer. The method may include placing an electrical component in the component hole. The electrical component has a conductive structure on both ends of the electrical component. The electrical component is substantially parallel to the first surface. The method may include forming a laminate layer on the first surface of the base layer, the second surface of the base layer, and between the base layer and the electrical component. The method may include creating a pair of via holes, where the pair of holes align with the conductive structures on both ends of the electrical component. The method may include forming a conductive via in the pair of via holes.

Figure 1:
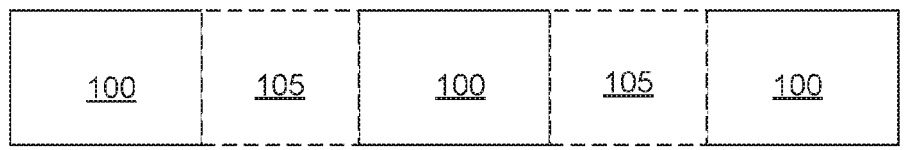
FIG. 1 depicts a cross sectional view of a base layer after the formation of holes through the base layer, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 5° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention. 2.5 and 3D technologies are one mechanism of increasing chip performance. In such technologies, the thickness of the die is a contributing factor in performance. Thus, removing unnecessary structures in the die, and specifically the wiring of the die, can lead to a thinner die and increased performance. Structures such as deep trench capacitors, which serve to dampen power fluctuations, may add to unnecessary thickness of the die, and may accomplish the same goals when placed in other places in a microelectronics package.

Referring to FIG. 1, through holes 105 may be created in the base layer 100. The base layer 100 may be a dielectric material, an organic material or silicon. Non-limiting examples of the dielectric material include, for example, epoxy, polyphenylether, polyphenyloxide, oxides, nitrides, oxynitrides of silicon, and combinations thereof. Oxides, nitrides and oxynitrides of other elements are also envisioned. The material in the base layer 100 may be selected, or tuned, so the coefficient of thermal expansion (CTE) of the material matches, or is sufficiently similar, to the CTE of a substrate or die that may be subsequently attached. In addition, the base layer 100 may include crystalline or non-crystalline dielectric material. In one embodiment, the base layer 100 may have a thickness, in some embodiments, ranging from about 400 µm to about 800 µm.

The through holes 105 may be created using mechanical, chemical or laser techniques. The through holes 105 may be spaced such that they align with the placement of vias in subsequent steps. In an embodiment, the alignment may be between power and ground vias, and for processors may be concentrated in the center of the interposer. In one embodiment, a mechanical punch or drill may be used to create the through hole 105, starting on one surface of the base layer 100, and extending to the opposite surface of the base layer 100. Additional embodiments may use techniques such as laser ablation, or patterning and etching away the unpatterned portions of the base layer 100. Through holes 105 should be big enough to support the placement of any desired electrical components, such as a capacitor, resistor or inductor. Further, through holes 105 may have a width from about 100 to about 1000 µm.

Figure 2:
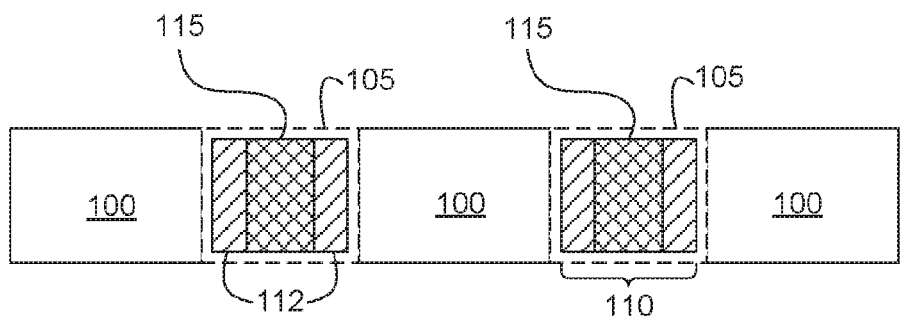
FIG. 2 depicts a cross sectional view of placement of a capacitor in the holes in the base layer, according to an example embodiment.

Referring to FIG. 2, a capacitor 110 may be placed in the through hole 105. The capacitor includes a conductive structure 112 located on each side of a dielectric layer 115. The capacitor 110 may be oriented such that the conductive structure 112 and dielectric layer 115 are parallel, or substantially parallel, to the through hole 105, and perpendicular to the surface of base layer 100. The conductive structure 112 may be made of any conductive material such as, for example, copper, aluminum, tungsten, or any other suitable material. The dielectric layer 115 may be made of any suitable dielectric material such as, for example, epoxy, polyphenylether, polyphenyloxide, and oxides, nitrides or oxynitrides of silicon. Further, while capacitor 110 is depicted as having 2 conductive structures 112 separated by a dielectric layer 115, it should be noted that the depiction is for simplicity, and other capacitor geometries are contemplated. For example, multi-layered capacitors (such as multilayer ceramic capacitors) and decoupling capacitors may be used. Further, it should be noted that capacitor 110 may instead be a resistor or inductor, depending on system requirements.

Figure 3:
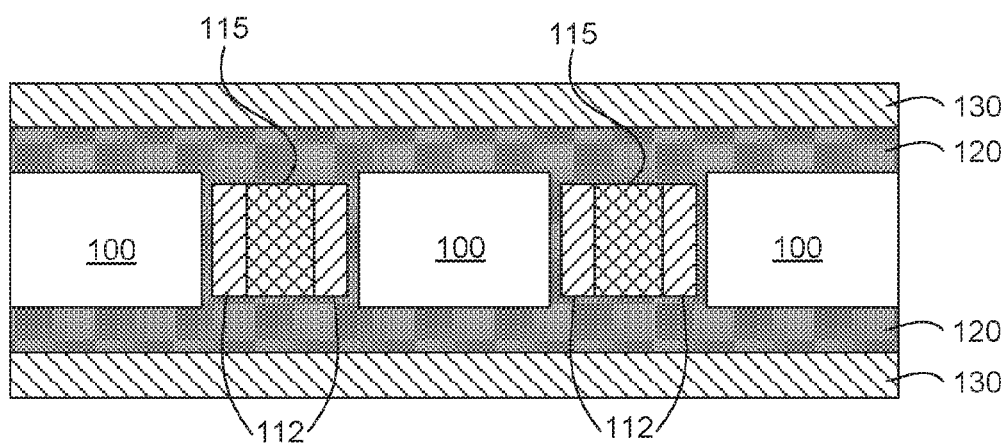
FIG. 3 depicts a cross sectional view of formation of a laminate layer and conductive layer, according to an example embodiment.

Referring to FIG. 3, a laminate layer 120 may be deposited on both sides of the base layer 100, and may encase the capacitor 110. Subsequently, a conductive layer 130 may be formed on the laminate layer 120. The laminate layer 120 may be made of any suitable organic material such as, for example, an epoxy laminate. The laminate layer 120 may be deposited using any number of techniques such as, for example, spin coating to B-stage adhesive lamination. The conductive layer 130 may be made of any conductive material such as, for example, copper, aluminum, tungsten, or any other suitable material. The conductive layer 130 may be deposited using any number of techniques such as, for example, electroplating.

Figure 4:
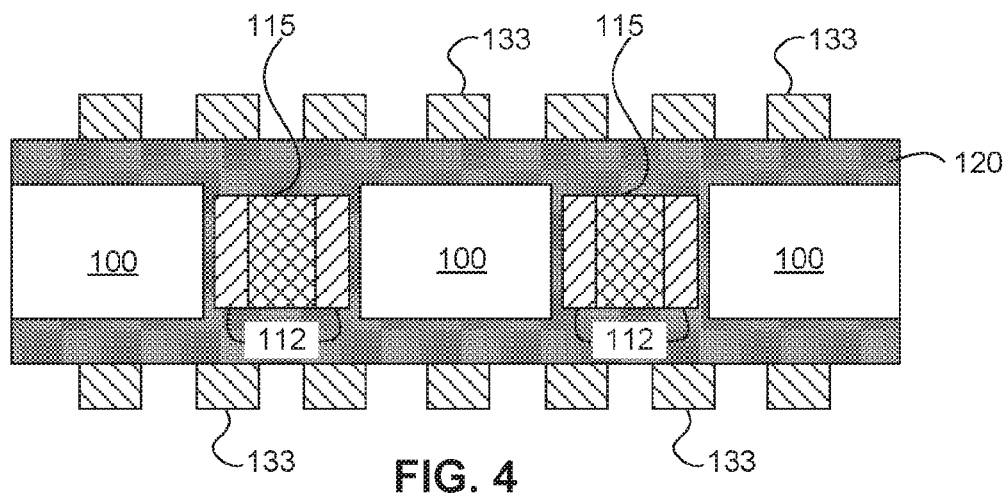
FIG. 4 depicts a cross sectional view of creating a conductive pattern in the conductive layer, according to an example embodiment.

Referring to FIG. 4, conductive layer 130 is patterned and etched, forming conductive pattern 133. The pattern applied, and thus created as conductive pattern 133, may be as conductive pads or a redistribution layer (RDL), which may aid in subsequent bonding or electrical distribution. In one embodiment, a photolithographic pattern may be applied to the surface of the conductive layer 130, and an anisotropic process, such as, for example, reactive ion etching (RIE) or plasma etching, may be used to remove the unpatterned material, leaving conductive pattern 133. In another embodiment, laser ablation may be used to remove unwanted portions of the conductive layer 130, leaving conductive pattern 133.

Figure 5:
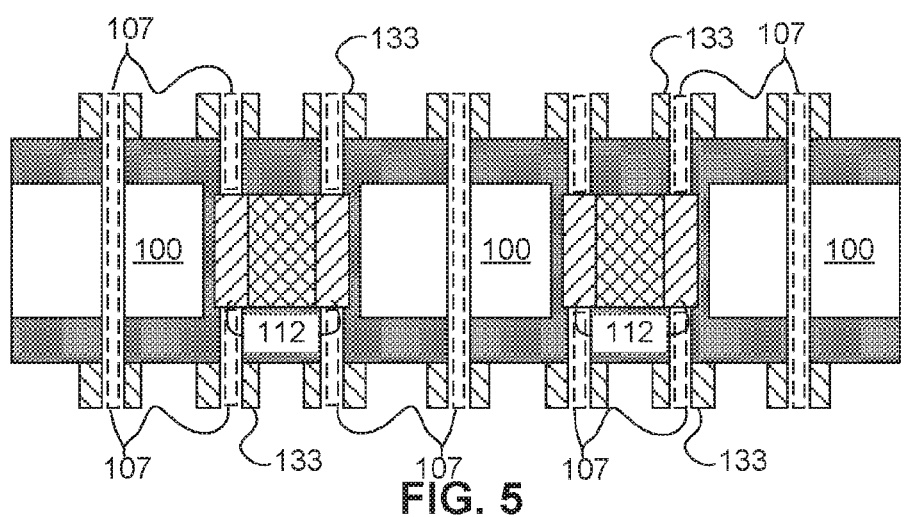
FIG. 5 depicts a cross sectional view of formation of via holes through the conductive pattern, base layer, and laminate layer, according to an example embodiment.

Referring to FIG. 5, via holes 107 may be formed through the base layer 100, the laminate layer 120 and the conductive pattern 133. The via holes may be patterned in such a way that they correspond to electrical connections on a die and substrate that will subsequently be attached. In one embodiment, the via holes 107 may be formed using a photolithography process followed by an anisotropic etching process such as reactive ion etching (RIE) or plasma etching. In another embodiment, the via holes 107 may be formed using laser ablation techniques.

Figure 6:
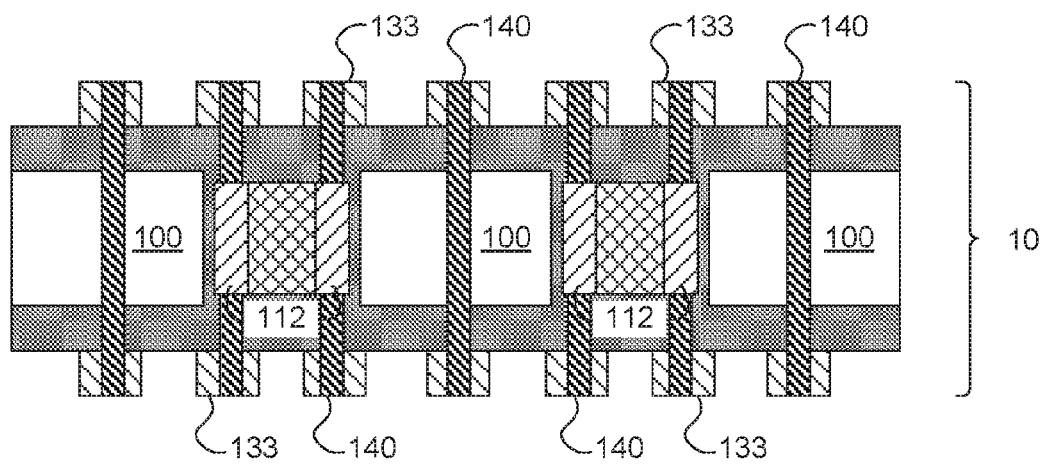
FIG. 6 depicts a cross sectional view of creating conductive vias in the via holes, according to an example embodiment.

Referring to FIG. 6, conductive vias 140 may be formed, and an interposer 10 is created. Formation of the conductive vias 140 may be performed using a plating process for filling via holes 107. The conductive vias 140 may be formed from a metallic material such as, for example, copper, aluminum, tungsten, or any other suitable material.

Figure 7:
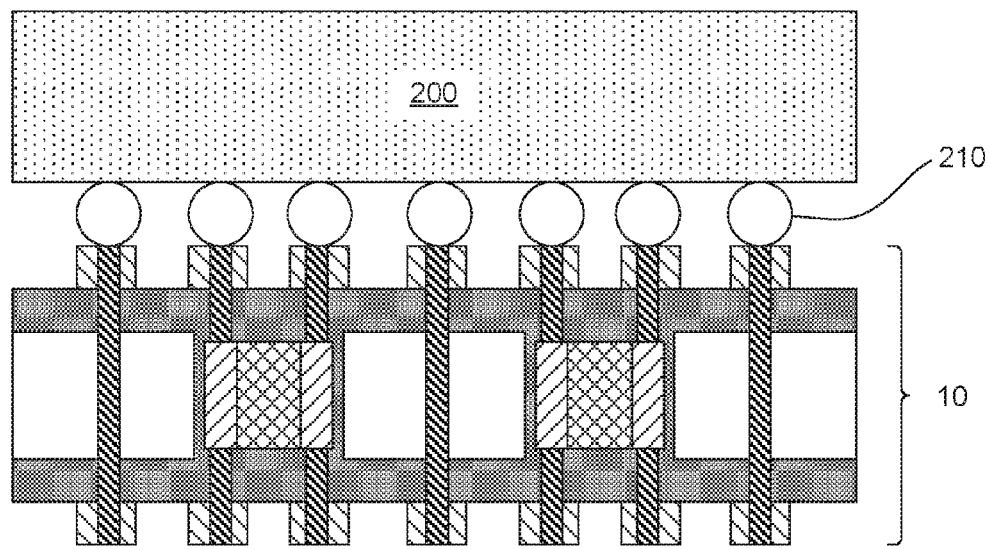
FIG. 7 depicts a cross sectional view of joining a interposer to a die, according to an example embodiment.

Referring to FIG. 7, interposer 10 may be connected to a die 200, such as, for example, a processor, memory, etc. In one embodiment, the die 200 may be connected to the interposer 10 using electrical connection 210. Electrical connection 210 may be any material capable of forming an electrical and mechanical connection between the die 200 and interposer 10. In one example embodiment, electrical connection 210 may be a series of solder bumps that have undergone a reflow process (e.g. melting and fusing), joining the die 200 and interposer 10. This may be performed by depositing the solder bumps above the conductive via 140, and using thermal compression to allow for reflow of the solder bumps in order to create an electromechanical connection. In such embodiments, the conductive vias 140 (and thus solder bumps) would be aligned with conductive wiring (not shown) located in the substrate 300. In an example embodiment, electrical connection 210 may be the only physical connection between the die 200 and interposer 10 (i.e. no underfill is used). This may be accomplished in instances where the CTE for the die 200 and interposer 10 are the same, or sufficiently similar such that the unwanted properties would not arise (e.g. stress causing warpage or fracture from differences in CTE). In such embodiments, removal of die 200 without damage to either the die 200, or interposer 10 may be accomplished.

Figure 8:
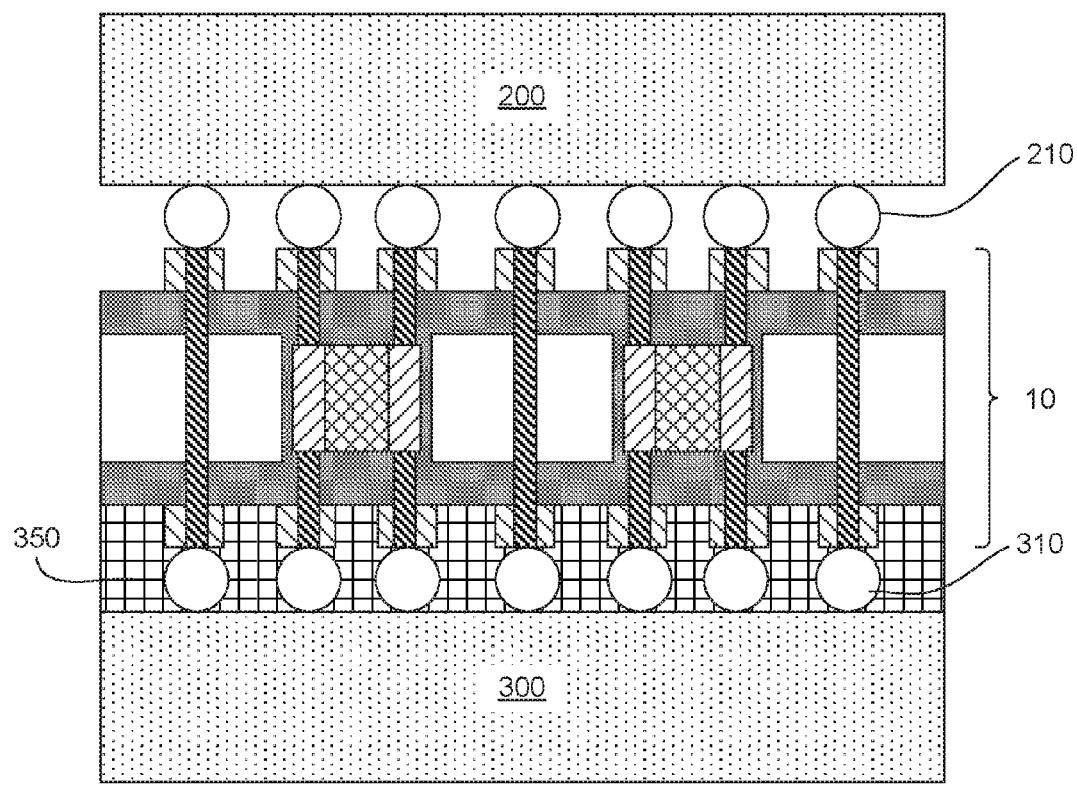
FIG. 8 depicts a cross sectional view of joining the interposer to a substrate, according to an example embodiment.

Referring to FIG. 8, interposer 10 may be connected to a substrate 300, such as a package substrate. The substrate 300 may be an additional die (similar to die 200), or a package substrate. This may be performed by depositing the solder bumps above the conductive via 140, and using thermal compression to allow for reflow of the solder bumps in order to create an electromechanical connection. In such embodiments, the conductive vias 140 (and thus solder bumps) would be aligned with conductive wiring (not shown) located in the substrate 300. In embodiments where the substrate 300 is a package substrate with a CTE that does not match the interposer 10, a curable non-conductive polymeric underfill material is dispensed onto the substrate 300 adjacent to the chip and is drawn into the gap by capillary action, forming underfill layer 350. The underfill material provides environmental protection, and mechanically locks together the interposer 10 and the die 200 so that differences in thermal expansion of the two materials do not break the solder fused connection 330. The underfill material may comprise one or more polymerizable monomers, polyurethane prepolymers, constituents of block copolymers, and constituents of radial copolymers, initiators, catalysts, cross-linking agents, stabilizers, and the like. Such materials polymeric materials contain molecules that are chained or cross-linked to form a strong bonding material as they are cured and hardened.

Following the connection, interposer 10 may allow current to flow between the substrate 300 and die 200. The interposer 10 may be connected to the front side of the die 200, or alternatively may be attached to the back side of the die 200 and form electrical connections through TSVs located throughout the die 200. The introduction of capacitor 110 may allow for dampening of power noise (e.g. fluctuations in voltage or amperage), by attenuating the flow of charge into, or out of, the die 200. Additionally, by bringing the capacitor 110 closer to the die, loop inductance for the system is reduced, which improves the dampening of the power noise. Further, by matching the CTE of the die 200 and interposer 10, underfill is not required to secure the joinder, and thus the separation of the die 200 and interposer 10 can be performed with little or no damage to either.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
    forming a component hole from a first surface to a second surface of a base layer;
    placing an electrical component in the component hole, wherein the electrical component comprises a conductive structure on both ends of the electrical component, and wherein the electrical component is substantially parallel to the first surface;
    forming a laminate layer on the first surface of the base layer, the second surface of the base layer, and between the base layer and the electrical component;
    forming conductive pads on the laminate layer, wherein each conductive pad is a separate structure on a surface of the laminate layer from the other conductive pads;
    creating via holes through each of the conductive pads, wherein the via holes extend from the conductive structures on both ends of the electrical component to the first surface of the base layer and the second surface of the base layer; and
    forming a conductive via in the via holes.

2. The method of claim 1, further comprising:
    forming a conductive layer on the laminate layer;
    forming a pattern above the conductive layer; and
    removing an unpatterned portion of the conductive layer, leaving a patterned conductive layer.

3. The method of claim 1, further comprising attaching a portion of the conducting via at the first surface to a semiconductor die.

4. The method of claim 3, wherein a coefficient of thermal expansion for the semiconductor die matches a coefficient of thermal expansion for the base layer.

5. The method of claim 1, further comprising attaching a portion of the conducting via at the second surface to a package substrate.

6. The method of claim 5, further comprising forming an underfill layer between the package substrate and the laminate layer.

7. The method of claim 1, wherein forming the component hole comprises removing material from the base layer using a mechanical punch or a drill.

8. The method of claim 1, wherein a material of the base layer comprises a dielectric material or an organic polymer.

9. The method of claim 1, wherein a material of the laminate layer comprises an epoxy laminate.

10. The method of claim 1, wherein a material of the conductive via comprises copper, aluminum or tungsten.

11. The method of claim 1, wherein the electrical component is a capacitor.

12. The method of claim 11, wherein the capacitor is a multi-layer capacitor.

13. The method of claim 1, wherein the electrical component is a resistor.

14. The method of claim 1, wherein the electrical component is an inductor.

* * * * *